United States Patent [19]

Samuels

[11] Patent Number: 4,633,050
[45] Date of Patent: Dec. 30, 1986

[54] NICKEL/INDIUM ALLOY FOR USE IN THE MANUFACTURE OF ELECTRICAL CONTACT AREAS ELECTRICAL DEVICES

[75] Inventor: George J. Samuels, Syracuse, N.Y.

[73] Assignee: Allied Corporation, Morris Township, Morris County, N.J.

[21] Appl. No.: 714,848

[22] Filed: Mar. 26, 1985

Related U.S. Application Data

[63] Continuation-in-part of Ser. No. 605,435, Apr. 30, 1984, abandoned.

[51] Int. Cl.$^4$ .................. C25D 3/56; H01H 1/02
[52] U.S. Cl. .................. 200/268; 200/267; 204/15; 204/40; 204/43.1; 204/44.5; 420/441; 420/555; 428/642; 428/672; 428/680
[58] Field of Search .................. 204/43.1, 44.5, 123, 204/40, 15; 420/555, 441; 200/266, 267, 268; 428/642, 672, 680

[56] References Cited

U.S. PATENT DOCUMENTS 2,890,314  6/1959  Römer et al. .................. 200/266
3,857,683 12/1974  Castonguay .................. 428/642 X
4,111,690  9/1978  Harmsen .................. 200/266 X

FOREIGN PATENT DOCUMENTS 449849    7/1948  Canada .................. 200/266
2401342  11/1976  Fed. Rep. of Germany ..... 204/43.1
101686    5/1978  Japan .................. 428/642
527911   10/1972  Switzerland .................. 204/43.1
602879    6/1948  United Kingdom .................. 204/43.1
145102    4/1962  U.S.S.R. .................. 204/44.5
201871    9/1967  U.S.S.R. .................. 204/44.5

OTHER PUBLICATIONS

DeIorio et al., La Metallurgia, Italiana, No. 2, pp. 66-68, (1978).
Ionycheva et al., Transl. from Zashchita Metallov., vol. 17, No. 1, (1981).
Davidson et al., Plating, parts I and II, (1971).
Rossi et al., Transl. of Tecnol. Elettr. (Italy), No. 7-8, 82-6, Jul.-Aug. 1979.

Primary Examiner—G. L. Kaplan
Attorney, Agent, or Firm—Richard C. Stewart, II; Gerhard H. Fuchs

[57] ABSTRACT

This invention relates to electrical devices in which the electrical contact areas are plated with a nickel/indium alloy comprising 0.1-9 percent indium, balance nickel. The nickel/indium alloy layer may be coated with a precious metal such as gold.

25 Claims, 10 Drawing Figures

NICKEL/INDIUM ALLOY FOR USE IN THE MANUFACTURE OF ELECTRICAL CONTACT AREAS ELECTRICAL DEVICES

RELATED APPLICATIONS

This application is a continuation-in-part application of application Ser. No. 605,435, filed Apr. 30, 1984 and now abandoned.

DISCLOSURE OF THE INVENTION (1) Field of Art

This invention relates to a novel solderable alloy of nickel and indium which is useful in the manufacture of electrical devices. More particularly, this invention relates to a method of using such nickel/indium alloy in the manfacture of electrical devices in which the alloy is a total or partial replacement for gold in the construction of electrical contact areas. Still another aspect of this invention relates to such electrical devices manufactured in accordance with the method of this invention. Other aspects of this invention will become apparent from a purview of the specification and appended claims.

(2) The Prior Art

The electronics industry requires conductors and contacts to carry signals to and from components and components arrays. For many years, gold coatings have been required to assure high reliability in electronics connector applications. For example, in the manufacture of printed circuit boards, the edge contact areas of the board which provide electrical contact between the board and other electrical components in the system are usually coated with a layer of gold or a gold based alloy. Gold or gold alloys are especially useful in these applications because of their low contact resistance, resistance to corrosion, electrical conductivity, resistance to wear and solderability, and because of their inertness to oxidation.

During the last few years, there has been considerable interest in reducing the quantity of gold used on electrical devices for manufacture of electrical contact areas, while at the same time maintaining the same performance characteristics. This interest has been fueled by gold price volatility and by the relatively high cost of gold. Several substitutes for gold have been proposed. For example, the following amongst others, have been proposed as possible alternative electrodeposits to gold on electrical connectors: palladium, palladium/nickel alloys, ruthenium, and tin and tin alloys. Each of these substitutes have a number of disadvantages which limit their suitability as a direct replacement for gold.

While many recently developed palladium coatings demonstrate attractive features for certain applications, the use of palladium or palladium coatings is still approached with hesitation because of problems associated with its use. Among the list of potential problems are high stress and microcracking due to hydrogen outgassing, the formation of a non-conducting and frictional polymer films when palladium mates with itself due to the highly active and catalytic nature of the surface of the palladium electrodeposit, erratic wear characteristics, and less corrosion resistance than gold. In addition, palladium is difficult to electrodeposit in a highly ductile state. Recent advances have attempted to obviate some of the aforementioned difficulties. However, palladium based contacts have still proven to be unacceptable for a large range of applications and when used are usually used in combination with a thin layer of gold.

Some disadvantages associated with the use of ruthenium are that the deposits from all types of electrolytes are highly stressed and unless anode diaphragms are used the electrolytes themselves produce toxic, volatile ruthenium tetroxide at the anode. Suitable ruthenium complex plating salts for producing the metal are also very expensive.

The main disadvantage of tin and tin/lead alloys is that they have very poor wear resistance, are not resistant to oxidation and require relatively high voltages to break down insulating oxide films which form on their surfaces. Moreover, pure tin also has the disadvantage of tending to produce metal "whiskers".

SUMMARY OF THE INVENTION

In accordance with this invention there is provided a new and improved nickel/indium alloy which contains an "effective amount of indium" which alloy is useful as a total or partial replacement for gold in the manufacture of electrical contact areas of electrical devices. Yet another aspect of this invention relates to electrical devices in which the electrical contact areas are coated with a nickel/indium alloy containing an effective amount of indium, or a laminated coating of such nickel-/indium alloy, and a material comprised preponderantly of a precious metal such as gold, or a gold based alloy, and to a method of manufacturing such devices. As used herein "electrical contact areas" are those areas of electrical devices which form mating surfaces to provide electrical continuity.

BRIEF DESCRIPTION OF THE DRAWINGS

FIGS. 1 to 10 are a series of fragmentary sectional views corresponding to successive process steps in the preparation of a printed circuit board with plated through holes in which a nickel/indium alloy containing an "effective amount" of indium has totally or partially replaced gold.

DETAILED DESCRIPTION OF THE INVENTION

Figure 1:
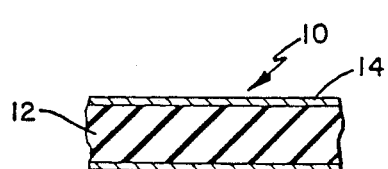
Figure 6:
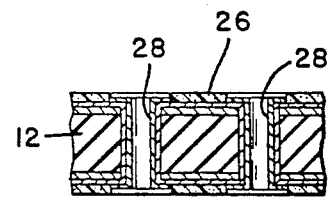

The nickel/indium alloy for use in this invention comprises an "effective amount" of indium. As used herein, "an effective amount" of indium is an amount which is sufficient to render the alloy solderable and/or which is sufficient to provide for superior contact and corrosion resistance while at the same providing good conducting properties. Generally, all or a portion of these alloy characteristics can be achieved where the alloy contains from about 0.1 to about 95 weight percent of indium by weight of the alloy. In the preferred embodiments of this invention the amount of indium in the alloy will vary from about 1 to about 25 weight percent indium by total weight of the alloy, and in the particularly preferred embodiments may vary from about 2 to about 20 weight percent indium on the same basis. Amongst these particularly preferred embodiments of the invention, alloys containing from about 3 to about 15 weight percent of indium based on the total weight of the alloy are especially preferred for used as the electrical contact areas of electrical devices, and those alloys in which the amount of indium is from about 4 to about 14 weight percent indium by weight of the alloy are most preferred for this application.

In the most preferred embodiments, the amount of indium in the alloy will vary depending on whether the electrical contact area is a male type contact or a female type contact area. For example, where the contact is a male type contact or a contact where the contact area is on an outside surface, the amount of indium in the alloy will preferably vary from about 3 to about 7 weight percent; and in those embodiments of the invention where the contact is a female type contact, or a contact where the contact area is on an inside surface, the amount of indium in the alloy is from about 6 to about 14 weight percent.

The nickel/indium alloy for use in the practice of this invention can be prepared by electrodepositing same from a plating bath preferably on to a conducting metal, as for example copper, employing conventional electrodeposition techniques. Useful electrodeposition techniques include both barrel and rack plating procedures. Such conventional electrodeposition techniques which are described in detail in "Electroplating Engineering Handbook" by A. Kenneth Grahams, Ed, Van Nostrand Reinhold Co., NY, NY (1971) are well known in the electroplating art and will not be described herein in any great detail.

In the preferred embodiments of this invention, the alloy is electroplated from the novel bath claimed in my co-pending U.S. patent application Ser. No. 714,849, entitled "Novel Nickel/Indium Alloy and Method of Same in the Manufacture of Printed Circuit Boards", filed concurrently herewith. The novel bath of the invention comprises:
 (a) at least about 0.5 M nickel cations and at least about 0.001 M indium cations;
 (b) up to about 2.6 M chloride ions;
 (c) a buffer material in an amount sufficient to maintain the bath pH of equal to or less than about 5;
 (d) an "effective amount of" one or more chelating agents; and
 (e) water.

In the preferred embodiments of this invention, the concentration of nickel cations and indium cations in the bath are, respectively, from about 0.5 M to about 2.5 M, and from about 0.001 to about 1 M. In the particularly preferred embodiments of the invention, the concentration of nickel cations and indium cations in the bath are, respectively, from about 0.5 M to about 2.0 M, and from about 0.009 M to about 0.1 M. Amongst these particularly preferred embodiments, most preferred are those embodiments in which the concentration of nickel cations and indium cations in the bath are, respectively, from about 1 M to about 2 M, and from about 0.015 M to about 0.06 M.

The bath of this invention includes one or more chelating agents capable of chelating indium cations. The types of chelating agents employed in the conduct of this invention can vary widely. For example, useful chelating agents include chelating agents capable of chelating ferric iron ($Fe^{3+}$). Illustrative of such chelating agents are those described in Ramunas J. Matekaitis and Arthur E. Martell, *Inorganic Chemistry*, 1980, 19, pp.1646–1651; Wesley R. Harris and Arthur E. Martell, *Inorganic Chemistry*, 15, 713 (1976); and Martell, A.E. and Smith, R.M., "Critical Stability Constants", Fe(III) and include the following compounds: adipyl, suberyl, sebacyl, dodecanedioyl, gluconic acid, saccharic acid, glyceric acid, bicine, catechol, iminodiacetic acid, nitrilotriacetic acid, ((hydroxyethyl)imino) diacetic acid, cyclohexanediamine tetraacetic acid, diethylenetriaminepentaacetic acid, salicyclic acid, chromotropic acid, hydroxamic acid, N,N'-bis(0-hydroxybenzyl)ethylenediamine-N,N'-diacetic acid, ethylene-1,2-bis(O-hydroxy)phenylglycine, N-hydroxybenzyliminodiacetic acid, N-hydroxyethylethylenediamine-N,N',N'-triacetic acid, N,N'-ethylenediaminediacetic acid, N,N-ethylenediaminediacetic acid, N,N-bis(2-aminoethyl)glycine, N,N'-diglycylethylenediamine-N'',N''-tetraacetic acid, N-hydroxyethyliminodiacetic acid, N-(2-hydroxy-5-sulfobenzyl)ethylenediamine-N,N'-bis(methylenephosphoric) acid, triethylene tetramine hexaacetic acid, tetraethylene pentamine heptaacetic acid, ethylenediamine-N,N'-diacetic-N-N'-bis(methylenephosphonic) acid, glycine-N,N'bis(methylene phosphonic) acid, ethylenediamine-N,N'-bis(methylene phosphonic) acid, 1-hydroxythane-1,1-disphosphonic acid, (2-hydroxybenzyl)imino bis-(methylene phosphonic) acid, ethylenediamine-N,N,N',N'-tetrakis(-methylene phosphonic) acid, and N(phosphonomethyl)iminodiacetic acid. Other useful chelating agents for use in the practice of this invention include carboxylic acids having one or more carboxy functions ("carboxylic acids"), carboxylic acids having one or more carboxy functions and one or more hydroxy functions ("hydroxycarboxylic acids") and carboxylic acid functions having one or more amino functions and one or more carboxy functions ("aminocarboxylic acids") and salts thereof. Illustrative of such materials are: citric acid, malonic acid, tartaric acid, adipic acid, phthalic acid, oxalic acid, glutaric acid, isophthalic acid, maleic acid, fumaric acid, succinic acid, glycolic acid, glyoxylic acid, glutamic acid, glyceric acid, malic acid, lactic acid, hydroxybutyric acid, mandelic acid, valine, arginine, aspartic acid, pyruric acid, glutamine, leucine, lysine, threonine, isoleucine, valine and asparagin. The chelating agents can be used alone, or combinations of chelating agents can be employed. For example, varying amounts of a relatively strong chelating agent such as ethylene diamine tetraacetic acid can be used in combination with varying amounts of one or more relatively weak chelating agents such as malonic acid, citric acid, malic acid and tartaric acid to control the amount of "electroactive indium", that is, the amount of indium which is available for electroplating.

Preferred chelating agents for use in the practice of this invention are relatively weak chelating agents such as carboxylic acids, as for example malonic acid and tartaric acid; hydroxycarboxylic acids, as for example citric acid and malic acid, and salts of such acids. Hydroxycarboxylic acids and their salts are particularly preferred for use, and citric acid, malic acids and their salts are most preferred.

The use of the chelating agent is believed critical for the electrodeposition of nickel/indium alloy having acceptable properties, and also for control over the amount of indium in the alloy and the variance of such amount as a function of the effective current density. While we do not wish to be bound by any theory, it is believed that proper selection of a chelating agent or combination of more than one chelating agents can effectively control the amount of indium species available for plating at relatively constant value over a relatively broad operating time. Thus, the use of such chelating agents provides for a means of control of the percentage of indium in the plate.

An "effective amount" of one or more chelating agents is included in the bath. As used herein, "an effective amount" of chelating agent is an amount which is effective for control of the amount of electroactive indium to any extent. The amount of the chelating agent can vary widely depending on a number of factors, including the type of chelating agent employed, the amount of electroactive indium desired, the desired concentration of indium in the plate, current density, the pH, etc. In general, the amount of chelating agent is at least about 0.001 M. In the preferred embodiments of the invention, the amount of chelating agent is from about 0.001 M to about 2.6 M, and in the particularly preferred embodiments, is from about 0.005 M to about 1.6 M. Amongst these particularly preferred embodiments of the invention, most preferred are those embodiments in which the amount of chelating agent in the bath is from about 0.05 M to about 0.25 M.

The nickel and indium cations for use in the plating bath used in this invention can be derived from any source. In the preferred embodiments of the invention, the nickel and indium cations are derived from nickel and/or indium chloride, nickel or indium carbonate, water-soluble nickel and/or indium salts of sulfamic acid, as well as hydroxycarboxylic acids, aminocarboxylic acids, which do not contain mercapto functions, and like nickel and/or indium salts of acids which can also function as chelators. Illustrative of useful water-soluble nickel and indium salts are the nickel and indium salts of citric acid, acetoacetic acid, glyoxylic acid, pyruric acid, glycolic acid, malonic acid, hydroxamic acid, iminodiacetic acid, salicylic acid, glyceric acid, succinic acid, malic acid, tartaric acid, hydroxybutyric acid, arginine, aspartic acid, asparagine, glutamic acid, glycine, glutamine, leucine, lysine, threonine, isoleucine, valine, and the like. In the preferred embodiments of the invention, the nickel and indium salts of sulfamic acid are employed as the source of nickel and indium, and in the particularly preferred embodiments of the invention, nickel and indium salts of sulfamic acid are used as the sources of nickel and indium.

The concentration of chloride ions in the bath is from 0 to about 2.6 M. The chloride ions may be obtained from any metal salt which will not electrodeposit under the operational conditions of the bath or from nickel and/or indium salts. Illustrative of such useful metal salts are sodium and potassium chloride, non-metal salts such as ammonium chloride, nickel or indium chloride and the like. The chloride ions are preferably derived form indium and/or nickel chloride, with nickel chloride being a particularly preferred source of chloride ions. In the preferred embodiments of the invention, the concentration of chloride ions in the bath is from about 0.001 M to about 2.6 M, and in the particularly preferred embodiments, the concentration of chloride ions in the bath is from about 0.005 M to about 1.6 M. Amongst these particularly preferred embodiments, most preferred are those embodiments in which the concentration of chloride ions in the bath is from about 0.05 M to about 0.25 M.

The plating bath of this invention usually has a pH equal to or less than about 5, preferably from about 1.4 to about 5.0, most preferably from about 2.3 to about 3.6. The pH of the plating bath can be maintained at the desired pH by the use of buffer materials. The type of buffer material used can vary widely, depending on the desired pH. For example, the pH can be maintained within the preferred pH range through use of such materials as boric acid, or can be adjusted by addition of basic materials, such as ammonium hydroxide, nickel carbonate, sodium hydroxide, triethylamine, triethanolamine, pyridine, sodium carbonate, and the like. The pH can also be adjusted through use of sulfonic acid or the hydroxy carboxylic acid, when a carboxylic acid or its salt is the chelating agent. The particular pH employed in the particularly preferred embodiments of the invention will depend on the particular buffer material used. For example, where a hydroxy carboxylic acid, such as citric acid, is the buffer material and chelating agent of choice, sufficient material is used to maintain the pH from about 1.4 to about 4.7, and preferably from about 1.8 to about 3.8. In the particularly preferred embodiments of the invention where a hydroxy carboxylic acid is used as the buffer material and chelating agent, the pH may vary from about 2.0 to about 2.8, and in the most preferred embodiments of the invention where a hydroxy carboxylic acid is used as the buffer material and chelating agent, the pH may vary from about 2.1 to about 2.7. On the other hand, experimentation has shown that best results are obtained when boric acid is the buffer material of choice if the pH is maintained in the range of from about 1.5 to about 3.5. In the preferred embodiments of the invention where boric acid is the buffer material of choice, the pH may vary from about 2.0 to about 3.0, and in the particularly preferred embodiments the pH may vary from about 2.5 to about 3.0. In the most preferred embodiments of the invention in which boric acid is the buffer material of choice, the pH can vary from about 2.8 to about 3.0.

In the preferred embodiments of the invention, the nickel/indium alloy is electrodeposited from the bath of copending U.S. patent application Ser. No. 605,352, entitled "Novel Nickel/Indium Alloy and Method of Using Same in the Manufacture of Printed Circuit Boards", filed Apr. 30, 1984. In the preferred bath of this invention, a combination of chelating agent and buffer selected from the group consisting of dicarboxylic acids, hydroxycarboxylic acids and salts thereof are employed. In general, such preferred baths will comprise:

(a) at least about 0.9 M nickel cations and at least about 0.001 M indium cations;
(b) up to about 2.6 M chloride ions;
(c) from about 0.25 M to about 1.6 M of a combination buffer material and chelating agent selected from the group consisting of dicarboxylic acids, hydroxycarboxylic acids and salts thereof; and
(d) water.

An especially efficacious plating bath for use in the practice of this invention comprises:

(a) from about 0.9 M to about 2. M of nickel ions;
(b) from about 0.4 M to about 2.5 chloride ions;
(c) from about 0.004 M to about 0.05 M of indium ions;
(d) from about 0.2 M to about 1 M of a combination buffer and chelating agent selected from the group consisting of dicarboxylic acids, hydroxy carboxylic acids and salts thereof, either alone or in combination with other chelating agents; and
(e) water.

The bath of this invention may include other optional ingredients which are normally used with or incorporated into plating baths. For example, the plating bath of this invention may include one or more compounds to reduce surface pitting, such as alkyl sulfonic acid salts and the like. Other optional materials which may be included in the bath of this invention are dextrose type stabilizers for indium. Additionally other alloy modifying agents, such as saccharin and counarin which affect the alloy characteristics such as internal stress and appearance of the alloy electroplated can also be included in the bath.

During electrodeposition procedure, the plating bath is normally maintained at a temperature of from about 10° C. to about 80° C. In the preferred embodiments of the invention, the electrodeposition temperature is from about 20° C. to about 65° C., and in the particularly preferred embodiments of the invention the electrodeposition temperature is from about 35° C. to about 65° C. Amongst the particularly preferred embodiments of the invention, most preferred are those embodiments in which the electrodeposition temperature is from about 35° C. to about 55° C.

In the electrodeposition procedure, current densities can vary widely depending on whether panel or barrel plating techniques are employed. However, in most embodiments of the invention where panel plating techniques are employed, the current density is usually maintained within the range of from about 1 to about 200 milliamperes per $cm^2$. In the preferred embodiments of the invention where panel plating techniques are employed, the current density is from about 5 to about 100 milliamperes per $cm^2$, and in the particularly preferred embodiments is from about 10 to about 60 milliamperes per $cm^2$. Amongst these particularly preferred embodiments where panel plating techniques are employed, most preferred are those embodiments in which the current density varies from about 20 to about 40 milliamperes per $cm^2$. When barrel plating techniques are employed, typical applied current densities are from about 2 to about 10 times less than the current densities used in panel plating.

In the most preferred embodiments of the invention using barrel plating techniques, the current density employed will vary depending on whether the contact area being electroplated is on an inside surface, i.e., female type contact, or on an outside surface, i.e., male type contact. In these most preferred embodiments, current densities used for plating male type contact areas will vary from about 3.2 to about 5.9 $mA/cm^2$, and for plating female type contact areas will vary from about 6.45 to about 9.7 $mA/cm^2$.

The electrodeposition process is carried out for a period of time sufficient to electrodeposit the desired amount of the nickel/indium alloy. As will be apparent to one of skill in the relevant art, electrodeposition times may vary widely depending on a number of factors, including but not limited to desired thickness of the electrodeposit, current density, bath temperature, plating techniques and other factors known to those skilled in the art. Typical plating times vary from a few minutes to several hours.

Broadly stated, the novel nickel/indium alloy is as a total or partial replacement for gold and gold based alloys in electrical devices where gold is now used as the electrical contacting surface. The alloy is especially useful in this application because of its superior contact and corrosion resistance. For example, the novel alloy of this invention can be used in the manufacture of electrical contact areas of electrical interconnecting devices, as for example connector pins and the like. These electrical devices are well known in the art and will not be described herein in great detail. Moreover the nickel/indium alloy can be used in the manufacture of electrical contact areas of switches as a partial or total replacement for gold in these devices, as well as in the construction of the electrical circuitry of such devices.

The nickel/indium alloy is particularly useful in the method of this invention for the construction of the electrical contact areas of printed circuit boards, switches, electrical connectors, chip carriers and the like. For example, the nickel/indium alloy can be used in the manufacture of the electrical contact areas of printed circuit boards manufactured by the subtractive, additive and semi-additive processes. The general technique of forming printed circuit boards by means of the subtractive, additive and semi-additive processes are very well known in the art and will not be described herein in any great detail. Examples of the subtractive, additive, and semi-additive processes are described in detail in U.S. Pat. Nos. 3,673,680; 4,135,988; 3,930,963; 3,625,758; 3,956,041; 3,854,973; 3,694,250; 3,628,999; 3,874,897; 3,960, 573; 3,635,758; 3,615,736; 3,865,623; and 4,217,182.

The following specific examples are presented to more particularly describe the invention.

EXAMPLE I

General Procedure:

Standardized commercially available nickel sulfamate ($Ni(SO_3NH_2)_2$) solution (2.55 M of nickel sulfamate) is partially diluted with deionized water or distill water so that the remainder of the bath components can be readily dissolved. Nickel chloride is added along with diammonium citrate. The pH is then adjusted to slightly greater that the desired pH of the working bath by addition of sulfamic acid, a mixture of nickel carbonate and ammonium hydroxide or hydrochloric acid. Next, indium sulfamate ($In(SO_3NH_2)_3$) as a hydrated salt, is added, followed by addition of a trace amount of a wetting agent (sodium lauryl sulfate). The bath is now brought to a volume of 1 liter by addition of distilled or deionized water and is ready to use. Using the above described procedure, a plating bath was prepared, the physical parameters of which are set forth in the following Table I.

TABLE I

| Component | Amount |
|---|---|
| (a) Nickel Sulfamate | 1.3 M |
| (b) Ammonium Citrate | 0.25 M |
| (c) Nickel Chloride | 0.075 M |
| (d) Indium Sulfamate | 0.013 M |
| (e) Sodium Lauryl Sulfate | 0.0004 M |

Using the plating bath of Table I, a series of experiments were conducted to evaluate the usefulness of the nickel/indium alloy as a total or partial replacement for gold in electrical connecting applications as for example in the electrical contact areas for connector pins, printed circuit boards, and other electrical devices. Using the plating bath and process conditions of Table II below, and conventional barrel plating techniques conventional, female and male electrical contacts were plated with the alloy of this invention.

TABLE II

| Operational Parameters | Value |
|---|---|
| (a) Temperature | 50° C. |
| (b) Current Density | 3.2 to 11 $mA/cm^2$ |
| (c) pH | ~2.3 |

The type of electrical contact and the % by weight of nickel and indium in the alloy are set forth in the following Table III.

TABLE III

| Batch No. | Type of Contact | % Composition % Ni | % In |
|---|---|---|---|
| 1. | Female | 87 | 13 |
| 2. | Male | 82 | 18 |
| 3. | Female | 91 | 9 |
| 4. | Male | 92 | 8 |

Each batch contained a total of 15 parts, for a total of 60 parts for the four batches.

The plating thickness of the nickel/indium alloy was measured on a sample lot from each batch using conventional metallographic techniques. The results indicate that the plating thickness for batch 1 and batch 2 varied from 0.00020 μm to 0.00040 μm and that the plating thickness for batch 3 and batch 4 varied from 0.00020 μm to 0.00060 μm.

Contact resistance ("CR") between a mated pairs of:
(a) batch 1 and batch 2
(b) batch 3 and batch 4
(c) batch 4 and batch 1
(d) batch 2 and batch 3,
were tested employing the procedures of MIL-C-39012. The contact resistance ("CR") of a control mated male and female pair was also tested using a standard center contact plating-gold plate Grade "B" (0.00127 cm minimum thickness) over beryllium/copper contacts using the procedures of Federal STD-100-15 and Federal STD-100-117. A comparison of the results indicated that the contact resistance of the nickel/indium alloy plated contacts was acceptable.

The batches were divided into four test groups and evaluated as follows:

A) Test Group 1 was evaluated in the Salt Spray Test for 48 hours using the procedure of MIL-STD-202, Method 101. The results of the Salt Spray Test are set forth in the following Table IV.

TABLE IV

| TEST GROUP 1 MALE FEMALE | NO. OF PAIRS TESTED | INITIAL CR in mΩ | AFTER SALT SPRAY CR in mΩ |
|---|---|---|---|
| batch 2 - batch 1 | 4 | 1.24 | 1.89 |
| batch 4 - batch 3 | 4 | 1.71 | 1.94 |
| batch 2 - batch 3 | 4 | NR* | 2.08 |
| batch 4 - batch 1 | 4 | NR* | 2.65 |
| GOLD - GOLD (Control) | 4 | 0.85 | 1.12 |

*not recorded (B) Test Group 2 (four replicas each) was evaluated in the Durability Test as follows: The male and female contact pairs were mechanically mated and unmated. Contact reistance ("CR") was measured initially and after 500, 1000 and 2000 mating cycles. The results of this test are set forth in the following Table V.

TABLE V

| TEST GROUP 2 MALE FEMALE | INITIAL CR in mΩ | CR in mΩ After 500 Cycles | CR in mΩ After 1,000 Cycles | CR in mΩ After 2,000 Cycles |
|---|---|---|---|---|
| batch 2 - batch 1 | 1.25 | 0.80 | 0.85 | 0.85 |
| batch 4 - batch 3 | 1.88 | 0.68 | 0.83 | 0.83 |
| batch 2 - batch 3 | NR* | NR* | 0.78 | 0.83 |
| batch 4 - batch 1 | NR* | NR* | 0.93 | 0.86 |
| GOLD - GOLD (Control) | 0.88 | 0.82 | 0.69 | 0.58 |

*not recorded (C) Test Group 3 was evaluated in the Thermal Shock Test and Moisture Resistance Test using MIL-STD-202, Method 107, test conditions C and MIL-STD-202, method 106, respectively. The results of the tests are set forth in the following Table VI.

TABLE VI

| TEST GROUP 3 MALE FEMALE | NO. OF PAIRS TESTED | INITIAL CR in mΩ | CR In mΩ After Thermal Shock | CR In mΩ After Moisture Resistance |
|---|---|---|---|---|
| batch 2 - batch 1 | 4 | 1.20 | 1.37 | 1.31 |
| batch 4 - batch 3 | 4 | 2.39 | 2.72 | 2.41 |
| batch 2 - batch 3 | 4 | NR* | NR* | 2.06 |
| batch 4 - batch 1 | 4 | NR* | NR* | 1.86 |
| GOLD - GOLD (control) | 4 | 0.92 | 1.82 | 1.85 |

*not recorded (D) Test Group 4 was evaluated for ductility, solderability, and adhesion as follows:

DUCTILITY TEST

The male and female connector parts were visually examined for flaws in the nickel/indium plating after manually crimping the part.

SOLDERABILITY TEST

Specimens are fluxed with a non-corrosive flux (Kestor Flux No. 1544) for 5 to 10 seconds, and then immersed in a solder composed of 40 percent lead and 60 percent tin for 3 seconds. The specimen is then removed and shaken lightly to remove excess solder. The specimens are then examined to determine the amount of the soldered coating adhering to the nickel/indium plating evenly without lump formation.

ADHESION TESTS (a) Bake Test—The specimens are baked at a temperature of 148.9° C. for one hour. After cooling, the specimens are visually inspected using a microscope at 10X magnification for blistering, peeling and flaking.

(b) Insertion Test—Mated pairs are connected and disconnected at least twice to a maximum of five times. The force at which the pairs are connected does not exceed a maximum of 3 pounds (2.270 kg). The specimens are examined visually for peeling or flaking which exposes underplate or base metal using a microscope at 10X magnification. If peeling or flaking is observed, magnification is increased to 30X to verify findings.

(c) Scratch Test (Cut Test)—A knife, razor or needle pointed probe is drawn across the fine ends and back ends of the female contact cutting through the nickel-/indium alloy to the base metal. The contact is cleaned using air pressure to remove loose particles from contact, and is examined visually using a microscope at 10X for any flaking or peeling radiating out from cuts. Only displaced material should be observed.

(d) Bend Test—The ends of the contacts are bent until fracture or until an angle of 90° is formed. The contacts are then observed visually using a microscope at 10X magnification for flaking, peeling or separation of plating from the base material or underplating.

The results of the above described tests are set forth in the following Tables VII and VIII.

TABLE VII

| TEST | NO. OF PAIRS CONTACTS TESTED | NO. OF PAIRS ACCEPT- ABLE | REJECTED |
|---|---|---|---|
| 1. Ductility | 3 | 3 | 0 |
| 2. Solderability | 3 | 3 | 0 |
| 3. Adhesion | | | |
| a. Bake Test | 7 | 7 | 0 |
| b. Insertion Test | 7 | 7 | 0 |
| c. Scratch Test | 4 | 4 | 0 |
| d. Bend Test | 3 | 3 | 0 |

TABLE VIII

| TEST | NO. OF PAIRS CONTACTS TESTED | NO. OF PAIRS ACCEPT- ABLE | REJECTED |
|---|---|---|---|
| 1. Ductility | 3 | 3 | 0 |
| 2. Solderability | 3 | 3 | 0 |
| 3. Adhesion | | | |
| a. Bake Test | 7 | 7 | 0 |
| b. Insertion Test | 7 | 7 | 0 |
| c. Scratch Test | 4 | 4 | 0 |
| d. Bend Test | 3 | 3 | 0 |

EXAMPLE II

Using the procedure of Example I, a plating bath was prepared, the physical parameters of which are set forth in the following Table IX.

TABLE IX

| Component | Amount |
|---|---|
| (a) Nickel Sulfamate | 500 mL per L of a 2.55 M aqueous solution |
| (b) Nickel Chloride Hexahydrate | 15 g/L |
| (c) Diammonium citrate | 60 g/L |
| (d) Indium Sulfamate pendadecahydrate | 5 g/L |

Using the plating bath of Table IX, and conventional barrel plating techniques, conventional female and male electrical contacts were plated with the nickle/indium alloy. The operational parameters for plating the male contacts are as set forth in the following Table X.

TABLE X

| Operational Parameters | Value |
|---|---|
| (a) Temperature | 45° C. |
| (b) Plating Time | 170 minutes |
| (c) Current Density | 4.6 mA/cm$^2$ |
| (d) pH | 2.6 adjusted w/NH$_4$OH |

The operational parameters for plating the female contacts are as set forth in the following Table XI.

TABLE XI

| Operational Parameters | Value |
|---|---|
| (a) Temperature | 45° C. |
| (b) Plating Time | 80 minutes |
| (c) Current Density | 9.7 mA/cm$^2$ |

TABLE XI-continued

| Operational Parameters | Value |
|---|---|
| (d) pH | 2.6 adjusted w/NH$_4$OH |

The type of contacts and the percent by weight of indium and nickel in the alloy at the contact areas are as set forth in the following Tabe XII.

TABLE XII

| Batch No. | Type of Contact | % Composition % In | % Ni |
|---|---|---|---|
| 1 | Female[1] | 4.3–5.3 | 95.7–94.7 |
| 2 | Male[2] | 3.2 | 96.8 |
| 3 | Female[3] | 4.3–5.3 | 95.7–94.7 |

[1]Female center connector pin for "N" series connectors manufactured and sold by Allied Corporation under the trade designation part 821919.
[2]Male center connection pin for "N" series connectors manufactured and sold by Allied Corporation under the trade designation 821922.
[3]Female center connector pin for "N" series connectors manufactured and sold by Allied Corporation under the trade designation part 822852-7.

The batches were divided into several test groups and pairs of female and male connectors were evaluated in the Salt Spray Test, Thermal Shock Test and Moisture Resistance Test employing the procedures described in Example I.

The results of the Salt Spray Test are set forth in the following Table XIII.

TABLE XIII

| TEST GROUP Male Female | No. of Pairs Tested | Mean Initial CR in mΩ | Mean CR After Salt Spray in mΩ |
|---|---|---|---|
| batch 3 - batch 1 | 32 | 0.957 | 1.106 |
| batch 3 - batch 2 | 32 | 0.979 | 1.571 |
| batch 3 - batch 2 | 90 | 0.938 | 1.616 |

The results of the Thermal Shock Test are set forth in the following Table XIV.

TABLE XIV

| TEST GROUP Male Female | No. of Pairs Tested | Mean Initial CR in mΩ | Mean CR in mΩ After Thermal Shock Test |
|---|---|---|---|
| batch 3 - batch 1 | 31 | 0.924 | 1.572 |
| batch 3 - batch 2 | 32 | 1.077 | 1.983 |

The results of the Moisture Resistance Test are set forth in the following Table XV.

TABLE XV

| TEST GROUP Male Female | No. of Pairs Tested | Mean Initial CR in mΩ | Mean CR After Moisture Test in mΩ |
|---|---|---|---|
| batch 3 - batch 1 | 31 | 0.964 | 1.659 |
| batch 3 - batch 2 | 31 | 1.584 | 1.983 |

EXAMPLE III

Referring now to the drawings, FIGS. 1-10 illustrate the sequence of the process steps in accordance with a preferred embodiment of this present invention for use of the nickel/indium alloy of the invention in the manufacture of printed circuit boards beginning with the basic process material and ending with the finished product, which is a double-sided printed circuit board with copper circuits, plated through-holes and optionally of gold edge contact areas in which the nickel/indium alloy of this invention is a total or partial replacement for gold.

The basic starting material is shown in FIG. 1 and consists of a commercially available laminated board 10. Board 10 consists of substrate 12 composed of an electrically non-conductive material as for example fiberglass reinforced epoxy resin or a thermo-plastic material. Substrate 12 is laminated with an extremely thin copper clad or film 14 and 16 on opposite sides thereof. Copper film 14 and 16 have a thickness of about 0.00356 cm while the substrate has a thickness of approximately about 0.157 cm.

Figure 2:
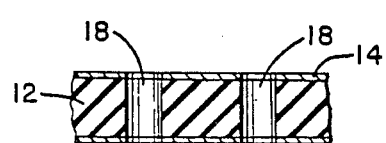

Holes or apertures 18 are formed through laminated board 10 at predetermined locations where plated through-holes are required. Holes 18 are illustrated in FIG. 2 and may be formed, for example, by drilling by a tape controlled drilling machine. Board 10 may be supported during the drilling process by either aluminum of a paper phenolic entry and exit material. After drilling, board 10 is cleaned.

It is desirable, initially, to sensitize the whole of board 10 and the exposed surfaces of substrate 12 at drilled holes 18. This may be effected by dipping board 10 in a suitable catalyst, such as palladium tin chloride.

Figure 3:
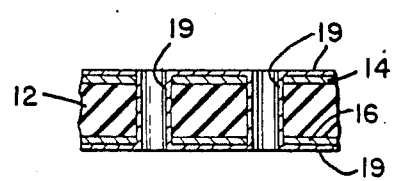
Figure 8:
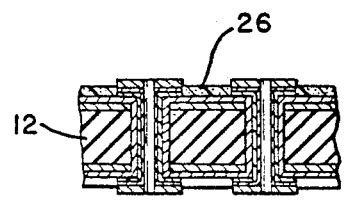

Subsequently, a thin film or layer of copper 19 is plated over board 10 by conventional electroless plating means. This may, for example, be effected by electroless copper plating to provide a film approximately 0.000254 cm thick. Layer 19 also covers the surfaces of the holes 18, as shown in FIG. 3. Preferably, however, a dry film photoresist is applied, and subsequently exposed and developed. To this end board 10 is initially cleaned. This may be effected by a sander or by a brush having fiber bristles and pumice. Subsequently, board 10 may receive a deionized or distilled water rinse, and may be dried by filtered compressed air.

A dry film photoresist layer 20 and 22 applied to opposite surfaces of board 10. Illustrative of suitable photoresist materials are DuPont Riston 218R ®. The photoresist layers may be applied by passing the resist and board through a laminator. This may be effected at a temperature between 104.5° C. and 124° C., depending upon the type of laminator utilized. The thickness of the photoresist layers 20 and 22 is determined by the desired thickness of the plated circuit. Normally, photoresist layers 20 and 22 are somewhat thicker, may be about 0.000762 cm than the desired thickness of the plated circuit. By way of example, to achieve a plated circuit of approximately 0.00381 cm thickness, photoresist layers 20 and 22 should have a thickness of about 0.00457 cm.

Figure 4:
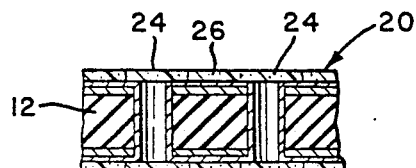

Thus-applied or laminated photoresist layers 20 and 22 are then photographically exposed through a suitable mask. Subsequently, photoresist layers 20 and 22 are developed. This will remove non-polymerized areas 24 which are susceptible to the developer. Areas 24 on photoresist layers 20 and 22 correspond to the areas of the circuits to be plated and to the surfaces of holes 18. Photoresist layers 20 and 22 then have polymerized areas 26 which are resistant to the etchant and which cover all other areas of photoresist layers 20 and 22 as shown in FIG. 4. Photoresist layers 20 and 22 may be exposed by a light source in a vacuum of 77.97 kPa or more for a time of approximately one and one-quarter minutes. Following exposure, the vacuum is released and photoresist layers 20 and 22 normalized at room temperature for at least 30 minutes. Then photoresist layers 20 and 22 may be developed in a suitable processor.

FIG. 5 illustrates board 10 after non-polymerized areas 24, which are susceptible to the developer, have been removed. This may, for example, be effected by immersion in a suitable developing solution which exposes holes or apertures 18 and the desired circuit images on both sides of the board.

Figure 7:
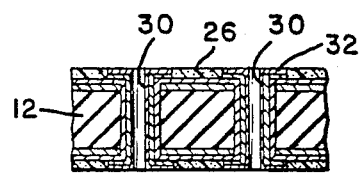

Board 10 is then electroplated with copper, pattern plating, so as to provide a required thickness of copper in the circuit image and on the inside surfaces of the drilled holes, all in the conventional manner. For example, photophosphate process may be used to achieve a minimum copper plating 30 (see FIG. 7) of 0.00254 cm over the surfaces of holes 18 and copper circuit 32 of approximately 0.00381 cm. The circuit plating 32 is contained within the boundary of the walls of polymerized photoresist 26 as shown in FIG. 7.

After the electro-copper plating step and on removal from the electroplating pattern plating bath, board 10 is washed with water in a dragout bath, water rinsed, subjected to an anti-tarnish treatment, e.g. in IMASA Cu-56 (Trade Mark) for about 1 to 2 minutes at about 20° to 25° C., water rinsed and dried. Exposed copper layers 30 and 32 are then cleaned for about 2 minutes in a micro-etch acid cleaner at about 20°–25° C., board 10 is rinsed in water for about 1 minute and in deionized water for about 25 minutes. The exposed copper layers 30 and 32 are then electroplated with a suitable metallic etch resist, as for example a tin/lead solder or a nickel-/indium alloy containing from about 0.3 to about 10 weight percent indium based on the total weight of the alloy and preferably from about 1 to about 3 weight percent indium on the aforementioned basis whose manufacture and use are described in detail in my copending U.S. patent application Ser. No. 605,352, entitled "Novel Nickel/Indium Alloy and Method of Using Same in the Manufacture of Printed Circuit Boards", filed Apr. 30, 1984.

Figure 9:
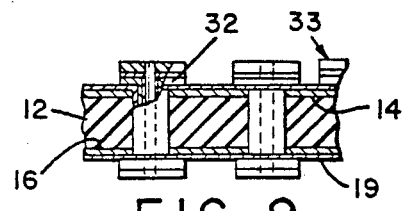
Figure 9:
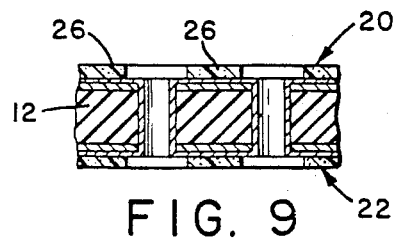

On removal from the electroplating bath, board 10 is washed with water in a dragout bath for about 10 seconds and then in a hot water bath for about 1 minute, rinsed in water and dried. Photoresist 26 is then removed by immersing board 10 in a first bath of alkaline solvent stripper, e.g., Robertsons EP-118, for about 10 minutes at about 60°–70° C., in a second bath of alkaline solvent stripper for about 5 minutes at about 60°–70° C. and passing board 10 through a hot alkaline solvent stripping brush machine at about 50° C. as shown in FIG. 9. Board 10 is then etched in conventional manner using an ammoniacal etchant, e.g., MacDermid 9151, at about 45° C. to remove copper from the areas of board 10 not covered by the nickel/indium etch resist care being taken to maintain the etchant within its normal operating limits and to avoid over-etching which can result in the edges of copper layers 30 and 32 becoming undercut to such an extent that slivers of the nickel/indium alloy, which acts as an etch resist during etching, can break off and contaminate the printed circuit. After etching, board 10 is rinsed in water, dried and masked for plating of the edge contact area only.

The nickel/indium alloys have electrical properties similar to that of gold. Thus the edge electrical 33 contacts can be provided either by simply plating copper layer 30 and 32 in the edge electrical contact 33 with nickel/indium alloy to a required thickness thereby forming the electrical contact 33 to totally replace gold. Alternatively, the edge electrical contacts 33 can be provided by first plating copper layers 30 and 32 in the edge contact area with a nickel/indium alloy to increase the thickness thereof on the layer 30 and 32 in the edge contact electrical area 33 and then plating with gold.

To prepare copper layers 30 and 32 in the edge contact area 33 for electroplating either with the nickel-/indium alloy or with gold, layers 30 and 32 are given a light chalk clean or hot alkaline clean, rinsed in 10% HCL for 25 seconds to remove chalk residues. Board 10 is then rinsed in water, and treated with 50% HCL for 1-1.25 minutes to reactivate the nickel in the nickel/indium alloy previously deposited on layer 30 and 32. The activated board 10 is rinsed in water for 1 minute and rinsed in deionized water for 25 seconds. If layers 30 and 32 in the edge contact area are to be first electroplated with the nickel/indium alloy, and then with gold the above preparation is carried out both before plating with the nickel/indium alloy and before plating with gold.

The electrical contact area 33 is electroplated with a nickel/indium alloy generally containing from about 1 to about 25 weight percent indium based on the total weight of the alloy, and preferably from about 2 to about 20 weight percent indium on the aforementioned basis. In the particularly preferred embodiments of the invention the alloy electroplated over the electrical contact area 33 contains from 3 to about 15 weight percent indium based on the total weight of the alloy and in the most preferred embodiments the alloy contains from about 4 to about 14 weight percent indium on the aforementioned basis. The nickel/indium alloy can be electroplated on to electrical contact area 33 using conventional plating procedures. The plating bath used and operational parameters are as set forth in the following Table XVI.

TABLE XVI

| (a) | Nickel Sulfamate | 1.3 M |
|---|---|---|
| (b) | Ammonium Citrate | 0.25 M |
| (c) | Nickel Chloride | 0.075 M |
| (d) | Indium Sulfamate | 0.013 M |
| (e) | Sodium Lauryl Sulfate | 0.0004 M |
| (f) | Temperature | 50° C. |
| (g) | Current density* | 15 mA/cm$^2$-60 mA/cm$^2$ |
| (h) | pH | ~2.3 |

*Current density will depend on the shape of the part being plated.

The plating is carried out for a period of time sufficient to build up desired thickness of nickel/indium alloy in the layers 30 and 32 in the edge contact area. In the preferred embodiments, where the nickel/indium alloy is used as a total replacement for gold, the thickness of the alloy is at least about 1 micron, and in the particularly preferred embodiments where total replacement of gold is desired is at least about 2.5 microns. In the preferred embodiments of the invention where the nickel/indium alloy of this invention is a partial replacement for gold the thickness of the alloy deposited is at least about 0.5 microns and in the particularly preferred embodiments is at least about 1.8 where partial replacement of gold is desired.

To gold plate nickel/indium alloy coated copper layers 30 and 32 in the edge contact area, board 10 is loaded into the plating bath, and electroplating is carried out at a current density of about 10 A/cm$^2$ (10 ASF), and a temperature of about 35° C. for a period of time (usually about 5 minutes) sufficient to build up the required thickness of gold, e.g., from about 0.25 to about 2.5 microns, and preferably from about 1 to about 1.3 microns, on nickel/indium alloy coated copper layers 30 and 32 in the edge contact area.

By the use of the method of the present invention the steps of masking the printed circuit, stripping the tin/lead from the edge contact area, removing the masking and applying a new mask, and reflowing the tin/lead alloy, all of which steps are essential in the conventional method when producing a printed circuit with gold plated edge contacts, can be completely avoided with consequent savings in both time and energy. Also, because the gold is either totally replaced by or is plated directly onto the nickel/indium alloy the difficulties associated with obtaining a good joint between the gold and the adjacent tin/lead alloy which are experienced in known methods are avoided. Moreover, nickel/indium alloys have a bright shiny appearance when electroplated onto the electrically conductive material in layers 30 and 32 and do not soften and run at normal soldering temperatures so that a completed printed circuit with components soldered thereon is more aesthetically pleasing in appearance than a conventionally produced printed circuit using tin/lead alloy and less likely to short circuit. In addition, no gold or less gold can be used in the edge contact area of a printed circuit with edge contacts, thus providing savings in precious metal.

Figure 10:
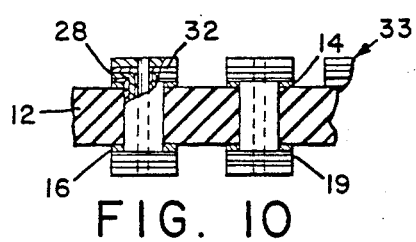

The finished plated through-hole printed circuit board is illustrated in FIG. 10 which can be used as a conventionally produced printed circuit board, e.g. it can have a solder mask applied thereto and components mounted thereon by a flow soldering technique.

What is claimed is:

1. An improved electrical device having improved electrical contact areas, said device of the type having one or more insulating positions and one or more electrical conductive portions, said contact areas in electrical connection with one or more of said conductive portions and adapted to engage and form mating surfaces with one or more electrical contact areas of one or more other electrical devices to provide electrical connection between said one or more conductive portions of said device, and said other devices, the improvement comprising electrical contact areas electroplated with a nickel/indium alloy consisting essentially of from about 0.1 to about 9 weight percent indium based on the total weight of the alloy and from about 99.9 to about 91 percent by weight nickel on the aforementioned basis.

2. A device according to claim 1 wherein said alloy is electrodeposited from an aqueous bath having a pH equal to or less than about 5, said bath which comprises:
   (a) at least about 0.5 M nickel cations and at least about 0.001 M indium cations;
   (b) up to about 2.6 M chloride ions;
   (c) a buffer material in an amount sufficient to maintain the pH of the bath at a value equal to or less than about 5;
   (d) an effective amount of one or more chelating agents; and
   (e) water.

3. A device according to claim 2 wherein said aqueous plating bath comprises:
   (a) from about 0.9 M to about 2 M of nickel cations;
   (b) from about 0.04 M to about 2.5 M chloride ions;
   (c) from about 0.004 M to about 0.05 M of indium sulfamate;
   (d) from about 0.25 to about 1.6 M of one or more chelating agents selected from the group consisting of hydroxycarboxylic acids, carboxylic acids and aminocarboxylic acids and salts thereof; and (e) water.

4. A device according to claim 3 wherein said pH is from about 1.7 to about 3.2.

5. A device according to claim 2 wherein said nickel and indium cation are derived totally or in part from water-soluble nickel and indium salts of sulfamic acid, carboxylic acids, hydroxycarboxylic or aminocarboxylic acids.

6. A device according to claim 5 wherein said nickel and indium cations are derived from salts of sulfamic acid.

7. A device according to claim 6 wherein said chloride ions are derived from nickel chloride or indium chloride.

8. A device according to claim 7 wherein said chloride ions are derived from nickel chloride.

9. A device according to claim 2 wherein said chelating agents are selected from the group consisting of dicarboxylic acids, hydroxycarboxylic acids and salts thereof.

10. A device according to claim 9 wherein said chelating agents are selected from the group consisting of hydroxycarboxylic acids and salts thereof.

11. A device according to claim 10 wherein said chelating agents are citric acid, malic acid or a salt thereof.

12. A device according to claim 11 wherein said chelating agents are citric acid and the amount of citric acid in said bath is from about 0.2 M to 1.3 M.

13. A device according to claim 12 wherein the amount of citric acid in said bath is from about 0.25 M out 0.7 M.

14. A device according to claim 9 wherein said chelating agents is a carboxylic acid.

15. A device according to claim 14 wherein said chelating agent is malonic acid or tartaric acid.

16. A device according to claim 1 which further comprises a material comprising preponderantly a precious metal electroplated onto all or a part of said nickel/indium alloy plated onto said electrical contact area.

17. A device according to claim 16 wherein said precious metal is selected from the group consisting of gold and gold based alloys.

18. A device according to claim 16 wherein said thickness of the nickel/indium alloy plated onto said contact area is at least about 0.5 microns.

19. A device according to claim 1 wherein the thickness of the nickel/indium alloy plated onto said electrical contact area is at least about 1.0 microns.

20. A device according to claim 19 wherein the thickness of the nickel/indium alloy is at least about 2.5 microns.

21. A device according to claim 1 wherein the weight percent indium is not greater than 8 weight percent indium based on the total weight of the alloy.

22. A device according to claim 21 wherein the weight percent indium in said alloy is from about 3.2 to about 5.3 weight percent indium based on the total weight of the alloy.

23. A device according to claim 22 wherein the weight percent indium in said alloy is from about 4.3 to about 5.3 weight percent indium based on the total weight of the alloy and from about 95.7% to about 94.7% nickel.

24. A device according to claim 23 wherein the weight percent indium in said alloy is from about 3 to about 7 weight percent indium based on the total weight of the alloy.

25. A device according to claim 1 wherein said device is adapted to engage and form mating surfaces, and disengage from said mating relationship.

* * * * *